(12) United States Patent
Ivanov et al.

(10) Patent No.: US 6,846,519 B2
(45) Date of Patent: Jan. 25, 2005

(54) METHOD AND APPARATUS FOR ELECTROLESS DEPOSITION WITH TEMPERATURE-CONTROLLED CHUCK

(75) Inventors: Igor C. Ivanov, Dublin, CA (US); Jonathan Welgun Zhang, San Jose, CA (US); Artur Kolics, San Jose, CA (US)

(73) Assignee: Blue29, LLC, Sunnyvale, CA (US)

( * ) Notice: Subject to any disclaimer, the term of this patent is extended or adjusted under 35 U.S.C. 154(b) by 0 days.

(21) Appl. No.: 10/242,331

(22) Filed: Sep. 13, 2002

(65) Prior Publication Data

US 2004/0052963 A1 Mar. 18, 2004

Related U.S. Application Data

(60) Provisional application No. 60/401,948, filed on Aug. 8, 2002.

(51) Int. Cl.$^7$ .................................................. B05D 1/18
(52) U.S. Cl. ................................. 427/430.1; 427/443.1; 427/437
(58) Field of Search ........................... 427/430.1, 443.1, 427/437

(56) References Cited

U.S. PATENT DOCUMENTS

| | | | |
|---|---|---|---|
| 4,324,854 A | * | 4/1982 | Beauchamp et al. ........ 430/296 |
| 5,177,878 A | | 1/1993 | Visser |
| 5,500,315 A | | 3/1996 | Calvert et al. |
| 5,775,416 A | | 7/1998 | Heimanson et al. |
| 5,830,805 A | | 11/1998 | Shacham-Diamand et al. |
| 6,042,712 A | | 3/2000 | Mathieu |
| 6,221,437 B1 | * | 4/2001 | Reynolds ................. 427/430.1 |
| 6,309,524 B1 | | 10/2001 | Woodruff et al. |
| 6,322,677 B1 | | 11/2001 | Woodruff et al. |
| 2003/0019426 A1 | * | 1/2003 | Inoue et al. ................. 118/429 |
| 2003/0134047 A1 | | 7/2003 | Dubin et al. |
| 2003/0152690 A1 | * | 8/2003 | Sung et al. .................... 427/8 |

FOREIGN PATENT DOCUMENTS

WO     WO 02/34962     5/2002

OTHER PUBLICATIONS

U.S. patent application Ser. No. 103,015, Ivanov et al., filed Mar. 22, 2002.

\* cited by examiner

*Primary Examiner*—Bret Chen
(74) *Attorney, Agent, or Firm*—Mollie E. Lettang; Daffer McDaniel, LLP

(57) ABSTRACT

The method for electroless deposition of a coating material, which may be a metal, semiconductor, or dielectric, that is carried out at a relatively low temperature of the working solution compensated by an increased temperature on the substrate which is controlled by a heater built into the substrate chuck. A decrease in the temperature of the working solution prevents thermal decomposition of the solution and reduces formation of gas bubbles, normally generated at increased temperatures. Accumulation of bubbles on the surface of the substrate is further prevented due to upwardly-facing orientation of the treated surface of the substrate. The substrate holder is equipped with a substrate heater and a substrate cooler, that can be used alternatingly for quick heating or cooling of the substrate surface.

19 Claims, 5 Drawing Sheets

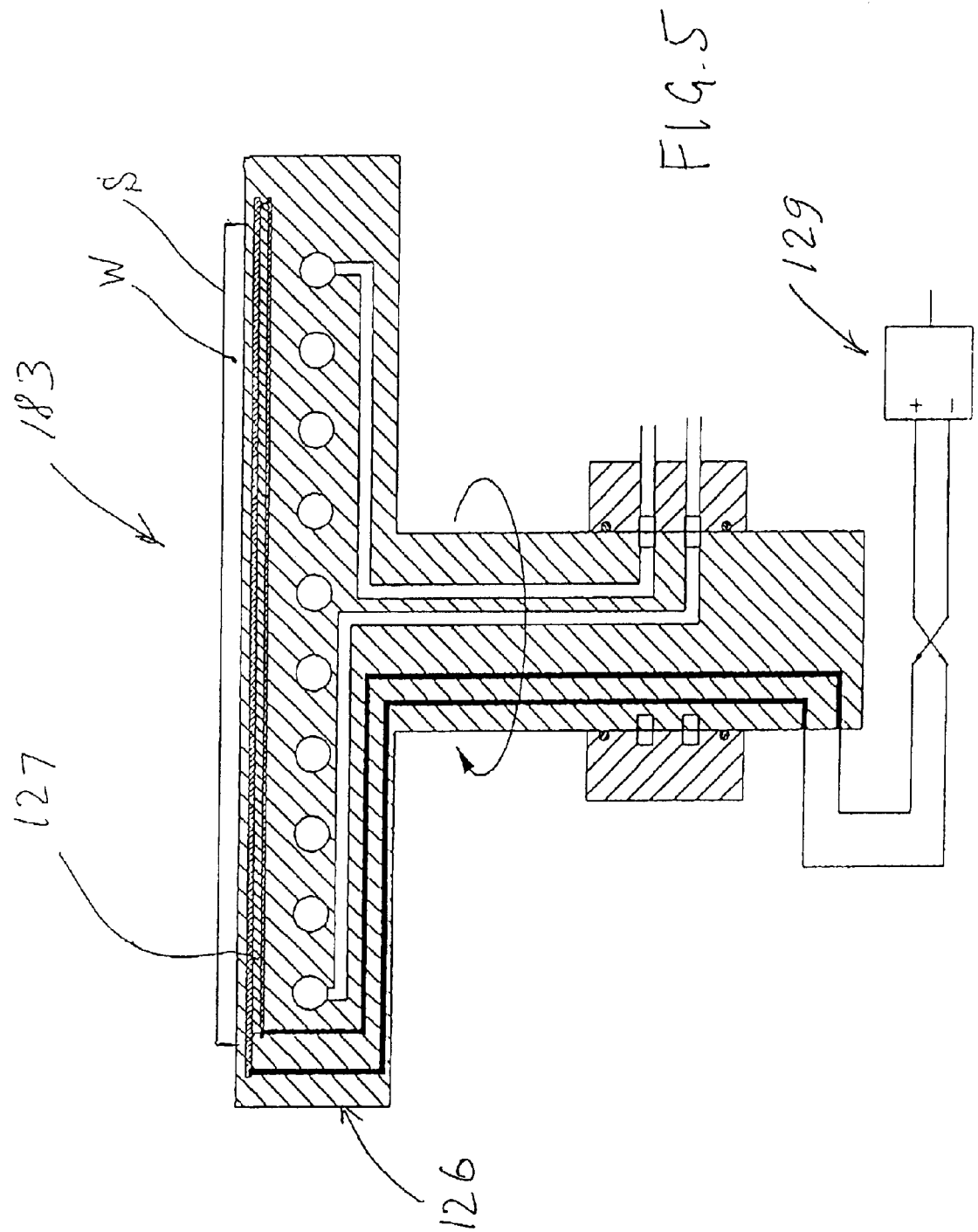

METHOD AND APPARATUS FOR ELECTROLESS DEPOSITION WITH TEMPERATURE-CONTROLLED CHUCK

This application claims benfit of provisioned application 60/401,948 filed Aug. 8, 2002.

FIELD OF THE INVENTION

The present invention relates to the field of semiconductor production, in particular, to an apparatus and method for electroless deposition of materials on semiconductor substrates. More specifically, the invention relates to electroless deposition with the use of a temperature-controlled chuck, which holds a substrate onto which a deposition is applied from a solution in the form of a thin metal film.

BACKGROUND OF THE INVENTION

Manufacturing of semiconductor devices, in particular integrated circuits having multiple-layered structures with various metal and non-metal layers laminated on a semiconductor substrate, typically involves an application of several metal layers onto a substrate or onto other previously deposited layers. These layers may have a complicated planar topology since these layers may constitute thousands of individual devices, which in combination form an integrated circuit or so-called "chip". Modem chips may have metal or dielectric layers with thicknesses from tens of Angstroms to fractions of a micron.

It is understood that thin metallic films used in integrated circuits of semiconductor devices function as conductors of electric current. Furthermore, it is known that densities of signal currents in metallic interconnections used in integrated circuits may reach extremely high values that generate such phenomena as electromigration associated with spatial transfer of mass of conductor films. Therefore the characteristics and properties of the deposited metal films (uniformity of film thickness, low electrical resistivity, etc.) determine performance characteristics and quality of the integrated circuit and of the semiconductor device as a whole.

In view of the above, thin metal films used in integrated circuits should satisfy very strict technical requirements relating to metal deposition processes, as well as to repeatability and controllability of the aforementioned processes.

A wide range of metals is utilized in the microelectronic manufacturing industry for the formation of integrated circuits. These metals include, for example, aluminum, nickel, tungsten, platinum, copper, cobalt, as well as alloys of electrically conductive compounds such as silicides, solders, etc. It is also known that coating films are applied onto substrates with the use of a variety of technological processes such chemical vapor deposition (CVD), physical vapor deposition (PVD), electroplating, and electroless plating. Of these techniques, electroplating and electroless plating or deposition tend to be the most economical and most promising for improvement in characteristics of the deposited films. Therefore, electroplating and electroless plating techniques successfully replaces other technologies.

Electroplating and electroless plating can be used for the deposition of continuous metal layers as well as patterned metal layers. One of the process sequences used by the microelectronic manufacturing industry to deposit metals onto semiconductor wafers is known to as "damascene" processing. In such processing, holes, commonly called "vias", trenches and/or other recesses are formed on a workpiece and filled with a metal, such as copper. In the damascene process, the wafer, with vias and trenches etched in the dielectric material, is first provided with a metallic seed layer, which is used to conduct electrical current during a subsequent metal electroplating step. If a metal such as copper is used, the seed layer is disposed over a barrier layer material, such as Ti, TiN, etc. The seed layer is a very thin layer of metal, which can be applied using one or more processes. For example, the seed layer of metal can be laid down using physical vapor deposition or chemical vapor deposition processes to produce a layer with the thickness on the order of 1,000 Angstroms. The seed layer can advantageously be formed of copper, gold, nickel, palladium, or other metals. The seed layer is formed over a surface, which may contain vias, trenches, or other recessed device features.

A metal layer is then electroplated onto the seed layer in the form of a continuous layer. The continuous layer is plated to form an overlying layer, with the goal of providing a metal layer that fills the trenches and vias and extends a certain amount above these features. Such a continuous layer will typically have a thickness on the order of 5,000 to 15,000 Angstroms (0.5–1.5 microns).

After the continuous layer has been electroplated onto the semiconductor wafer, excess metal material present outside of the vias, trenches, or other recesses is removed. The metal is removed to provide a resulting pattern of metal layer in the semiconductor integrated circuit being formed. The excess plated material can be removed, for example, using chemical mechanical planarization. Chemical mechanical planarization is a processing step, which uses the combined action of chemical removal agents, or a chemical removal agents with an abrasive, which grinds and polishes the exposed metal surface to remove undesired parts of the metal layer applied in the electroplating step.

Disadvantages associated with electroplating are technical problems in connection with designing of reactors used in the electroplating of semiconductor wafers. Utilization of a limited number of discrete electrical contacts (e.g., 8 contacts) with the seed layer about the perimeter of the wafer ordinarily produces higher current densities near the contact points than at other portions of the wafer. This non-uniform distribution of current across the wafer, in turn, causes non-uniform deposition of the plated metallic material. Current thieving, affected by the provision of electrically conductive elements other than those, which contact the seed layer, can be employed near the wafer contacts to minimize such non-uniformity. But such thieving techniques add to the complexity of electroplating equipment, and increase maintenance requirements.

The specific metal to be electroplated can also complicate the electroplating process. For example, electroplating of certain metals typically requires use of a seed layer having a relatively high electrical resistance. As a consequence, use of the typical plurality of electrical wafer contacts (for example, eight discrete contacts) may not provide adequate uniformity of the plated metal layer on the wafer. Reduction in sizes of such features as vias and trenches also requires thinner layers having higher resistivity, which in turn may generate a high potential drop from the wafer edges to the central part, whereby the rate of deposition in the central area is significantly reduced.

Beyond the problems discussed above, there are also other problems associated with electroplating reactors. As device sizes decrease, the need for tighter control over the processing environment increases. This includes control over the contaminants that affect the electroplating process. The moving components of the reactor, which tend to generate such contaminants, should therefore be subject to strict isolation requirements.

Still further, existing electroplating reactors are often difficult to maintain and/or reconfigure for different electroplating processes. Such difficulties must be overcome if an electroplating reactor design is to be accepted for large-scale manufacturing.

One drawback associated with copper deposition by electroplating is the fact that for very small features on microelectronic workpieces (sub 0.1 micron features), copper deposition by electroplating can lack conformity with the side walls of high aspect ratio vias and trenches, and can produce voids in the formed interconnects and plugs (vias). This is often due to the non-conformity of the copper seed layer deposited by PVD or CVD. As a result, the seed layer may not be thick enough to carry the current to the bottom of high aspect ratio features.

An alternate process for depositing copper onto a microelectronic workpiece is known as "electroless" plating which is the deposition of metals on a catalytic surface from a solution without an external source of current. For example, this process can be used as a preliminary step in preparing plastic articles for conventional electroplating. After cleaning and etching, the plastic surface is immersed in solutions that react to precipitate a catalytic metal in situ, palladium, for example. First the plastic is placed in an acidic stannous chloride solution, then into a solution of palladium chloride; palladium is reduced to its catalytic metallic state by the tin. Another way of producing a catalytic surface is to immerse the plastic article in a colloidal solution of palladium followed by immersion in an accelerator solution. The plastic article thus treated can now be plated with nickel or copper by the electroless method, which forms a conductive surface, which then can be plated with other metals by a conventional electroplating method.

Along with the electroplating method, the electroless method also has found wide application in the manufacture of semiconductor devices.

As compared to electroplating, electroless plating or deposition is a selective process, which can be realized with very thin seeds or without the use of seeds at all. Since an electroless process is not associated with the use of an external electric current source, electroless deposition results in more uniform coatings in view of the absence of discrete contacts. Electroless deposition can be realized with the use of simple and inexpensive equipment and with a high aspect ratio gap fill.

Given below are several examples of existing methods and apparatuses for electroless deposition, specifically for use in the manufacture of semiconductor devices.

For example, U.S. Pat. No. 5,500,315 issued in 1996 to J. Calvert, et al. discloses an electroless metal plating-catalyst system that overcomes many of the limitations of prior systems. In one aspect of the invention, the process comprises the steps of: providing a substrate with one or more chemical groups capable of ligating to an electroless deposition catalyst, at least a portion of the chemical groups being chemically bonded to the substrate; contacting the substrate with the electroless metal plating catalyst; and contacting the substrate with an electroless metal plating solution to form a metal deposit on the substrate. The chemical groups can be, for example, covalently bonded to the substrate. In another preferred aspect, the invention provides a process for selective electroless metallization, comprising steps of selectively modifying the reactivity of a substrate to an electroless metallization catalyst; contacting the substrate with the electroless metallization catalyst; and contacting the substrate with an electroless metallization solution to form a selective electroless deposit on the substrate. The substrate reactivity can be modified by selective treatment of catalyst ligating groups or precursors thereof on the substrate, for example by isomerization, photocleavage or other transformation of the ligating or precursor groups. Such-direct modification enables selective plating in a much more direct and convenient manner than prior selective plating techniques. Specifically, the aforementioned patent provides selective electroless deposition without the use of a photoresist or an adsorption type tin-containing plating catalyst.

Although the above method provides selective patterning of substrate ligating groups and although some of practical examples indicate different temperature of the solution, the invention does not teach methods for optimization of the electroless deposition process by controlling temperature of the solution or substrate holder. Furthermore, the aforementioned invention relates exclusively to a method and does not describe any electroless deposition equipment.

U.S. Pat. No. 6,309,524 granted to D. Woodruff, et al. in 2001 discloses, in one of its embodiments, a universal electroplating/electroless reactor for plating a metal onto surfaces of workpieces. An integrated tool for plating a workpiece comprises a first processing chamber for plating the workpiece using an electroless deposition process and a second processing chamber for plating the workpiece using an electroplating process. A robotic transfer mechanism is used that is programmed to transfer a workpiece to the first processing chamber for electroless deposition thereof and, in a subsequent operation, to transfer the workpiece to the second processing chamber for electroplating thereof.

It should be noted that a common problem in using bathes, which is especially true for the electroless deposition process, is that foreign particles or contaminants will be deposited on the substrate surface of the wafer when transferring the wafers from one bath to another bath. Another common problem is the exposure of the substrate surface of the wafer to air during the transfer (from bath to bath) can cause the non-wetting of deep and narrow trenches in the surface or small (contact) holes in the surface because of electrolyte evaporation. And yet another common problem is that exposure to air may cause oxidation of the catalytic surface that will result in poor catalytic activity and poor quality metal deposits. This problem becomes especially troublesome when using materials such as copper that easily oxidize in air. To produce high quality metal deposits in the submicron range, therefore, it is more desirable not to transfer the wafer between the processing chambers and to avoid exposing the wafer to air by using a single bath or processing chamber and moving the different fluids for each step in the process through the processing chamber. Furthermore, this patent also ignores such an important issue as temperature control of the solution and substrate.

The above problems are solved by the system described in U.S. Pat. No. 5,830,805 issued in 1998 to Y. Shacham-Diamand, et al. This patent discloses an electroless deposition apparatus and method of performing electroless deposition for processing a semiconductor wafer that use a closed processing chamber to subject the wafer to more than one processing fluid while retaining the wafer within the chamber. The invention is useful for manufacturing processes that include depositing, etching, cleaning, rinsing, and/or drying. The processing chamber used in the preferred embodiment of the apparatus of the above patent is an enclosed container capable of holding one or more semiconductor wafers. A distribution system introduces a first fluid into the chamber for processing the wafer and then removes the first fluid from the chamber after processing the wafer. The distribution system then introduces the next fluid into the chamber for processing the wafer and then removes the next fluid from the chamber after processing the wafer. This procedure continues until the manufacturing process finishes. The fluids used in the present invention depends on the process performed and may include fluids such as DI water, $N_2$ for flushing, and electrolytic solutions comprising reducing agents, complexing agents, or pH adjusters.

The fluid enters the sealed processing chamber through an inlet, and exits the chamber through an outlet. As the fluid enters the processing chamber, the fluid is dispersed across the wafer in a uniform flow. A recirculation system moves the fluid through the processing chamber using a temperature control system, chemical concentration monitoring system, pump system, and a filtration system before re-circulating the fluid back through the processing chamber.

Additional embodiments include: a rotatingly mounted tubular wafer housing with a wafer mounted on either or both sides of the housing surface; an inner core mounted inside of the tubular housing when mounting a wafer on the inside surface of the housing; and a dispersal apparatus for dispersing the fluid in a uniform flow over the wafer. The processing chamber can be provided with a heater and a temperature control system. However, the processing chamber is an open-type chamber and therefore does not allow pressure-controlled deposition processes. In addition, the open-type chamber does not provide adequate protection of the process against contamination of the solution.

In spite of their advantages, the known electroless processes have temperature of the working chemical solution as one of the main parameters. It is known that speed of deposition in an electroless process depends on the temperature in a degree close to exponential. For example, an article published in Electroless Nickel Plating, Finishing Publications Ltd., 1991, W. Riedel states (page 39 of the article) that temperature is the most important of parameters affecting the deposition rate and that for a Ni—P electroless process the deposition rate increases twofold for every 10 degrees of bath temperature.

Furthermore, for the metal interconnects on the surface of the wafer one of the major requirements is low resistivity. Copper was chosen as the close second best for fulfilling this requirement. However, due to the presence of various additives in the interface between the PVD Cu seeds and ECD Cu, resistivity is disproportionally increased as compared to much thinner electroless-deposited Cu layers. This phenomenon was reported by S. Lopatin at AMC, 2001.

It has been also shown by Y. Lantasov, et al. in "Microelectronics Engineering", No. 50 (2000), pp. 441–447, FIG. 2, that resistivity of ELD Cu strongly depends on deposition conditions, and that at higher temperatures it is possible to obtain a material with low resistivity.

However, it is understood that electroless deposition at high temperatures leads to significant non-uniformities in the deposited layers. This occurs due to local temperature fluctuations. The higher the temperature, the greater are such fluctuations. Stabilization of elevated temperatures in large volumes of the solution tanks is associated with the use of complicated temperature control systems and temperature maintaining systems (seals, thermal insulations, etc.). This, in turn, increases the cost of the equi merit and maintenance.

For the reasons described above, manufacturers of semiconductor equipment prefer to use electroless processes carried out at room temperature. Low speeds of deposition are compensated by utilizing a multiple-station deposition equipment with simultaneous operation of a number of substrates in a number of chambers arranged in series (see, e.g., U.S. Pat. No. 6,322,677 issued in 2001 to DE. Woodruff, et al.). Such equipment requires a large production space and dictates the use of large volumes of the solutions. Furthermore, an additional space is needed for the preparation, storage, and post-use treatment of the solutions. This, in turn, creates environmental problems.

Another common drawback of existing electroless deposition apparatuses is low speed of deposition, which in general depends on the type of the deposited material and even in the best case does not exceed 100 nm/min, but normally is much lower. For example, for CoWP the speed of deposition can be within the range from 5 nm/min to 10 nm/min.

In U.S. patent application Ser. No. 10/103,015 filed on Mar. 22, 2002, the applicants have substantially solved the problems of eletroplating and electroless deposition associated with the processes and apparatuses described above. More specifically, the apparatus described in the aforementioned patent application has a closable chamber that can be sealed and is capable of withstanding an increased pressure and high temperature. The chamber contains a substrate holder that can be rotated around a vertical axis, and an edge-grip mechanism inside the substrate holder. The deposition chamber has several inlet ports for the supply of various process liquids, such as deposition solutions, DI water for rinsing, etc., and a port for the supply of a gas under pressure. The apparatus is also provided with reservoirs and tanks for processing liquids and gases, as well as with a solution heater and a control system for controlling temperature and pressure in the chamber. The heater can be located outside the working chamber or built into the substrate holder, or both heaters can be used simultaneously. Uniform deposition is achieved by carrying out the deposition process under pressure and under temperature slightly below the boiling point of the solution. The solution can be supplied from above via a showerhead formed in the cover, or through the bottom of the chamber. Rinsing or other auxiliary solutions are supplied via a radially moveable chemical dispensing arm that can be arranged above the substrate parallel thereto.

The apparatus of U.S. patent application Ser No. 10/103, 015 provides uniform heating of the entire working solution by means of a heater located either outside of the deposition chamber with heating of the solution on the way to the chamber, or inside the cover of the deposition chamber. The main idea is to maintain the entire volume of the working solution at a uniform temperature. In general, the temperature can be adjusted, but should remain constant and at a relatively high level (e.g., 80 to 90° C.) all the time. However, although an elevated temperature of the working solution leads to essential increases in the productivity of the deposition process, the process requires constant replacement of the working solution since high temperature causes rapid thermal decomposition of the solution. Constant replacement of the solution should be carried out with high flow rates, and this, in turn, increases the cost of the production.

The undesired effect of permanent high temperature on the working solution can be explained as follows:

The electroless deposition is a process of reduction of metal ions, e.g., cobalt, tungsten, or the like, on the catalytically-active surface by electrons released during oxidation of a reducing agent (e.g., hypophosphite anions). Oxidation of the reducing agent is catalyzed by a substrate, and, in the case of the most widely accepted model, it can be assumed that the charge from the reducing agent is transferred to metal ions through the substrate and thus produces metal atoms on the substrate surface.

A simplified combined chemical reaction for the above process can be expressed as follows:

$$H_2PO_2^- + H_2O + Co^{++} = Co^o + H^+ + H_2PO_3$$

The reducing agent is consumed by deposition of metal on the processed part, by hydrolysis at high temperature (especially on hot spots of heating elements), by catalytic oxidation on particles generated by the deposition tool hardware, and by a reaction of reducing agent with reactive components (such as ethylene bonds, carboxyl groups, etc.) of the polymers used in tool construction.

At sufficiently high concentrations of contamination particles and/or at the boiling point of the solution, the composition can be spontaneously and completely decomposed by metal reduction at the surfaces of the aforementioned particles (and defects). As soon as few metal atoms are formed, they become a new nucleation sites for further continuous decomposition of the solution.

International Patent Application Publication No. WO 02/34962 (hereinafter referred to as International Application) disclosed on May 2, 2002 describes an electroless apparatus, in which the problem of thermal decomposition of the working solution is partially solved by utilizing a substrate holder with a heating device. The substrate holder of this apparatus has a substrate chuck for clamping the substrate during deposition in the working chamber in a position of the treated surface facing down.

The main disadvantage of the apparatus of the aforementioned International Application is that the substrate is oriented with the treated surface facing down. It is known that in a static condition of the solution or in processes with low-velocity flows of the solution, the aforementioned orientation of the substrate leads to accumulation of gas bubbles on the treated surface. The gas bubbles, in turn, violate conditions required for uniformity of deposition. In order to solve this problem, in the apparatus of the International Application the deposition chamber has a curvilinear bottom surface for guiding the flows of the working solution in specific paths over the facing-down surface of the substrate. However, even though the flows of the working solution generate some dynamic conditions on the edge surfaces of the substrate, a certain stagnation point will always remain in the central part of the substrate. This local area may accumulate gas bubbles. Furthermore, differential velocities of the flow on the substrate surface may lead to non-uniform temperature distribution. In other words, the apparatus of the International Application does not provide uniformity of electroless deposition.

In order to eliminate problems associated with accumulation of gas bubbles and stagnation of the solution in the central area of the chuck, one of the embodiments of the aforementioned apparatus includes a complicated kinematic system with wobbling motions of the rotating chuck. Such a complicated system makes the apparatus and products more expensive, while the process becomes difficult to control.

OBJECTS AND SUMMARY OF THE INVENTION

It is an object of the present invention to provide a method and apparatus for electroless deposition of thin films of high uniformity with the surface of the substrate to be treated facing upward. It is another object to allow the aforementioned apparatus and method to provide uniform electroless deposition without formation of stagnation areas under static conditions or at relatively low speeds of working solution flows. Still another object is to allow the aforementioned apparatus and method to provide uniform deposition of metals onto a substrate without thermal decomposition of the working solution due to the use of large volumes of working solutions at relatively low temperatures in combination with a temperature-controlled substrate holder. A further object is to allow the aforementioned apparatus and method to provide bubble-free deposition without the use of complicated substrate motion mechanisms.

It is another object of the invention to provide a method of electroless deposition with optimized control of temperature on the substrate and/or in the entire volume of the working solution.

The method of the invention consists in that electroless deposition of a coating material, which may be a metal, semiconductor, or dielectric, is carried out at a relatively low temperature of the working solution compensated by an increased temperature on the substrate which is controlled by a heater built into the substrate chuck. A decrease in the temperature of the working solution prevents thermal decomposition of the solution and reduces formation of gas bubbles, normally generated at increased temperatures. Accumulation of bubbles on the surface of the substrate is further prevented due to upwardly-facing orientation of the treated surface of the substrate. The remaining units of the apparatus, i.e., a closable chamber with inlet ports for the supply of various process liquids and a port for the supply of a gas under pressure, reservoirs and tanks for processing liquids and gases, a solution heater and a control system for controlling temperature and pressure in the chamber, etc. are the same as in the apparatus disclosed in the aforementioned earlier patent application of the same applicant.

BRIEF DESCRIPTION OF THE DRAWINGS

FIG. 5 is a schematic vertical sectional view of a substrate temperature control unit in the form of a Peltier-type device in combination with a circulation-fluid cooler.

DETAILED DESCRIPTION OF THE INVENTION

Figure 1:
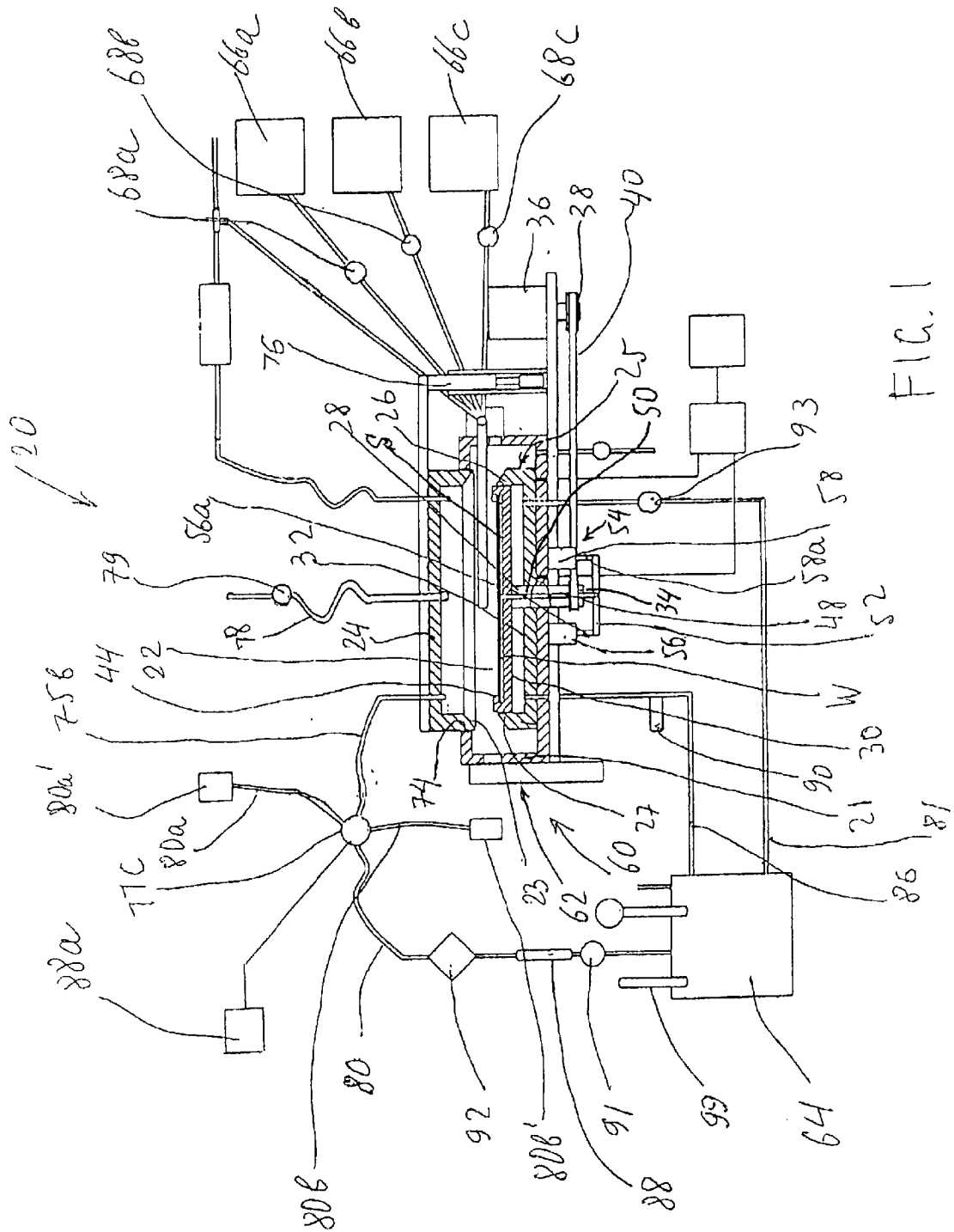
FIG. 1 is a schematic view of an electroless apparatus made in accordance with one embodiment of the invention.

The electroless-plating apparatus of the invention, which is schematically shown in FIG. 1 and is designated as a whole by reference numeral 20, has a housing 21 that contains an electroless-plating chamber 22 (hereinafter referred to as "chamber 22") that can be hermetically closed with a cover 24 located above the chamber 22. In a closed state, the chamber 22 may withstand increased pressures and is provided with appropriate seals (not shown) between the connected parts, such as the cover, chamber, ports, feedthrough devices, fittings, etc. More specifically, the pressure that can be developed inside the chamber 22 may reach 2 atmospheres above the atmospheric pressure or be reduced below the atmospheric pressure, e.g., down to 0.1 atmospheres.

The chamber 22 is either made of or has the inner surface coated with a chemically stable material that can withstand the action of aggressive solutions used in the operation process of the apparatus 20 under high temperatures and under high pressures. Examples of such materials are Teflon, ceramics of certain types, or the like.

The chamber 22 contains a substrate holder 26, which can be rotated inside the chamber 22 by a shaft 28 that is attached to the lower side 30 of the substrate holder 26. The shaft 28 sealingly passes through the bottom 32 of the chamber 22 and rigidly supports on its outer end a gear wheel 34. This gear wheel 34 is driven into rotation from a motor 36 via another gear wheel 38 on the output shaft of the motor 36. The gear wheels 34 and 38 are interconnected via a synchronization belt 40.

The substrate holder 26 has a plate-like shape and is provided with an edge-grip mechanism 44 located in the upper part of the substrate holder for gripping, fixing, and supporting a substrate W placed onto the upper surface of the edge-grip mechanism 44.

The shaft 28 has a central through hole 48. A rod 50 is sealingly and slidingly inserted into the chamber 22 via the hole 48. The upper end of the rod 50 is rigidly connected to the bottom of the edge-grip mechanism 44, while the lower end of the rod 50 is connected to a cross beam or plate 52 that extends to the outer side of the apparatus 20 via a bearing (not shown). The plate 52, in turn, is connected to a linear drive mechanism 54, which in the embodiment shown in FIG. 1 is made in the form of a couple of pneumatic cylinders 56 and 58 having their respective piston rods 56a and 58a rigidly connected to the plate 52.

The housing 21 has a wafer loading port 60 that can be opened or closed by a gate mechanism 62. The loading port 60 is opened when the cover 24 is lifted for loading a wafer W into the substrate holder 26 via the port 60, e.g., with a mechanical arm of the robot (not shown) that can be installed outside the apparatus 20 with the position of the mechanical arm aligned with the loading port 60.

Arranged around the apparatus 20 are control and auxiliary devices shown in FIG. 1. It is understood that these devices are shown as examples, since the types and characteristics of these devices will depend on specific purpose and functions of the apparatus.

In the embodiment shown in FIG. 1 the auxiliary system contains a group of tanks for solutions and gases. Reference numeral 64 designates a main deposition solution supply tank. Reference numeral 75b designates a pipe for the supply of fluid to the working chamber 22. The fluid may comprise a liquid or gas, the supply of which is controlled from a three-way valve 77c (FIG. 1) which can be switched either to a first position for the supply to the working chamber 22 of the working solution from the tank 64 by a pump 91 via a temperature control unit 88, a filter 92, and a pipe 80, to the second position for the supply of water via a supply pipe 80a from a water tank 80a', or to a third position for the supply of gas from a gas reservoir 80b' via a pipe 80b. In FIG. 1, reference numeral 88a designates a controller.

The apparatus also includes a second compressed gas supply line 78, e.g., for the supply of gaseous nitrogen into the interior of the chamber 22 or for quick evacuation of the gas from the chamber 22, e.g., for drying. The aforementioned deposition solution line 80 is connected to the tank 64 for the supply of the deposition solution into the chamber 22 from above the substrate W. Reference numeral 79 designates a pressure sensor for measure inner pressure of gas in the chamber 22.

Reference numerals 66a, 66b, 66c . . . designate auxiliary chemical supply tanks for storing various chemical reagents required for the electroless deposition, as well as rinsing solutions, including deionized water for final rinsing. Reference numerals 68a, 68b, 68c . . . designate solenoid valves that open and close connection of tanks 66a, 66b, 66c with the interior of the housing 21 and hence of the chamber 22.

From the interior of the chamber 22, the solution returns to the tank 64 for recirculation via a solution return line 86. The temperature control of the solution is carried out by means of an auxiliary temperature control unit 88, while the temperature of the solution is constantly measured with the use of a temperature sensor 90 installed in the solution return line 86.

Figure 2:
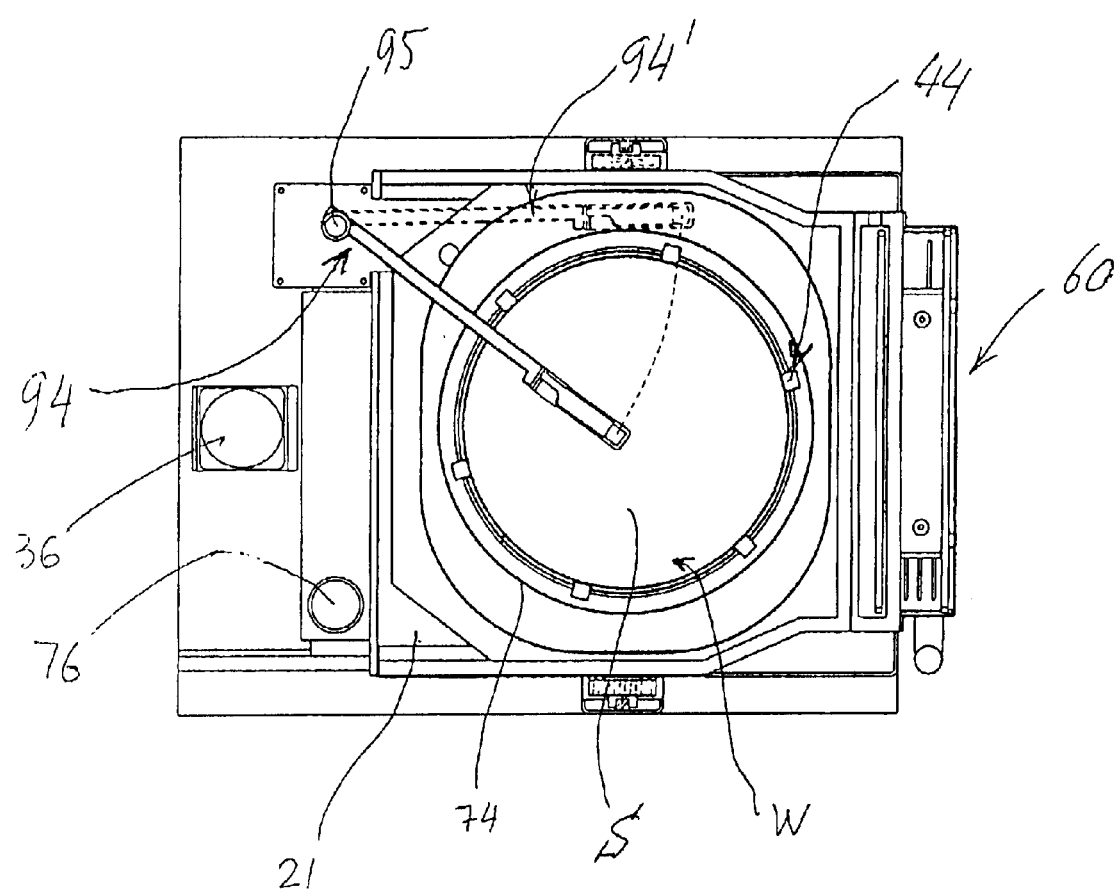
FIG. 2 is a top view of the substrate W fixed in the edge-grip mechanism.

Another essential device of the apparatus 20 of the invention is a chemical dispensing arm 94 shown in FIG. 2, which is a top view of the substrate W fixed in the edge-grip mechanism 44. The chemical dispensing arm 94 is normally located outside the chamber 22, e.g., in the position 94' shown by broke lines in FIG. 2. For this purpose, the outer end of the chemical dispensing arm 94 is connected to a respective rotary drive mechanism (not shown) for swinging motions of the arm 94 around an axis 95 from the position shown by broke lines to the position shown by solid lines.

Some of the tanks may contain a wetting liquid for the supply onto the treated surface S (FIG. 2) of the substrate W secured in the chuck 26 with the surface S facing upward towards the pipe 75b (shown in FIG. 1) and the chemical dispensing arm 94. The upwardly-facing orientation of the treated surface of the substrate prevents accumulation of bubbles on the treated surface. The construction of the substrate-holder of the present invention also prevents formation of stagnation areas under static conditions or at relatively low speeds of working solution flows.

The wetting liquid may comprise the same working solution which is used for deposition or may comprise a specific liquid with improved wetting properties neutral with respect to the agents and materials participating in the deposition. This can be, e.g., water or alcohol.

As shown in FIG. 1, the bottom 32 of the chamber 22 rigidly supports a cup-shaped cover support 25, which is open upward. The upper edge 27 (FIG. 1) of the cover support 25 is also beveled to match the edge 23 of the cover and to form a closed space defined by the cover 24 and the cup-shaped cover support 25. When the cover 24 moves down, the edge 23 rests onto the edge 27.

The cover 24 is slidingly and sealingly installed in a guide opening 74 formed in the upper part of the chamber 22. The cover can be moved mechanically, e.g., by a pneumatic cylinder 76. In view of mobility of the cover 24, hydraulic and pneumatic connections with the cover are made in the form of hoses or other flexible pipings.

The chamber 22 is also provided with another deposition solution supply line 81, which goes from the tank 64 to the bottom 32 of the chamber 24 for the supply of the deposition solution by a pump 93 to the chamber 24 from below the chuck 26. Such a supply may be required in some cases to provide more favorable conditions for application of the deposition solution onto the surface of the substrate W.

Figure 3:
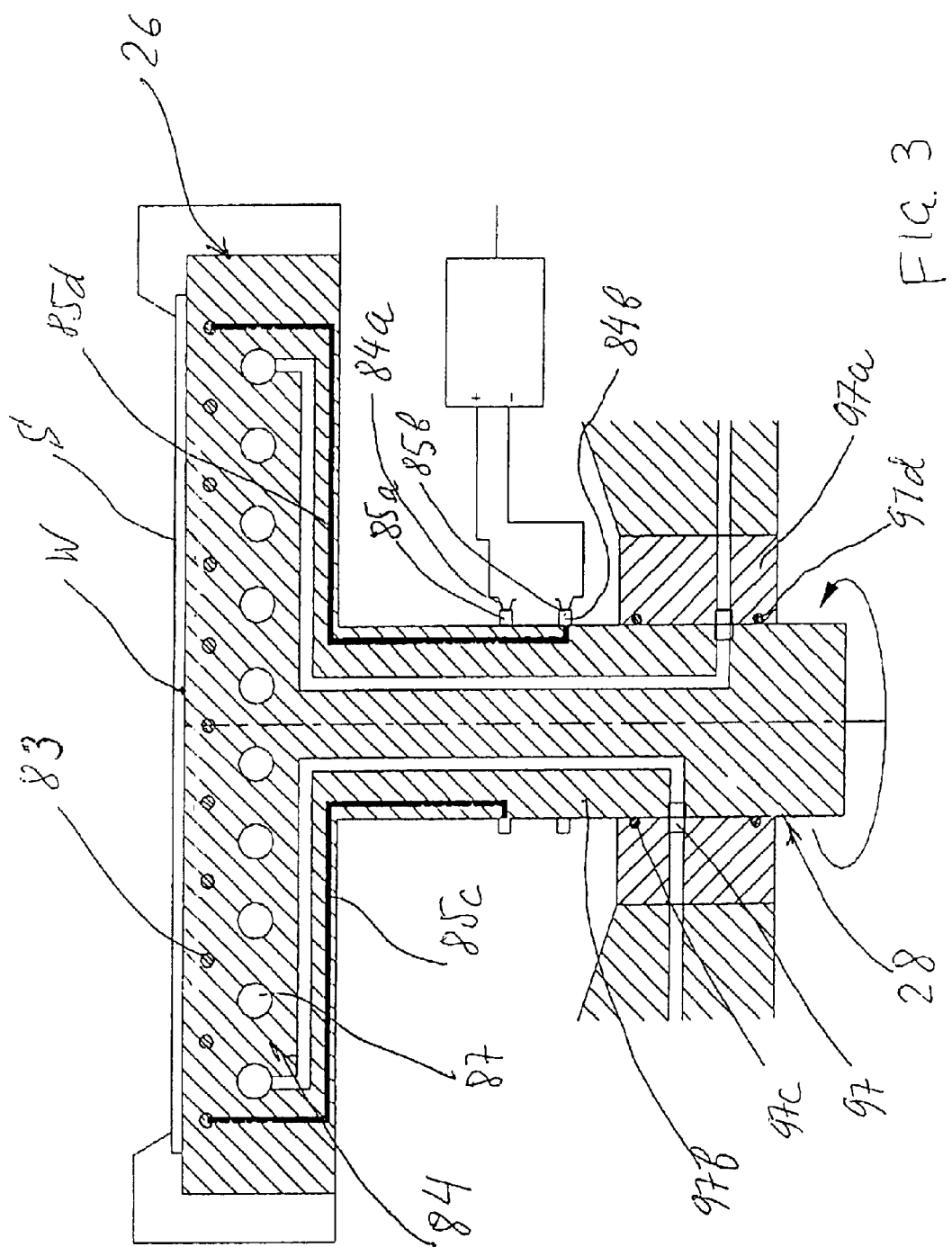
FIG. 3 is a schematic view of a substrate holder with an electric heater and a circulation-fluid cooler built into the body of the substrate holder.

FIG. 3 is a schematic vertical sectional view through the substrate holder with an electric heater and a circulation-fluid cooler built into the body of the substrate holder. As shown in FIG. 3, the heater-cooler unit 84 is built into the body of the substrate holder 26 and may work in the mode of heating or cooling. The supply of electric current to the heater 83 is carried out through sliding current contacts 84a, 84b which are in electrical contact with current collecting rings 85a, 85b on the rotating shaft 28 (FIG. 1), which are connected to the heater 83 by conductors 85c and 85d.

Reference numeral 87 designates a cooling unit, which also is built into the body of the chuck 26 and is intended for rapid cooling of the chuck, when it may be required by a technological process. The cooling unit 87 can be made in the form of a spiral channel for the passage of a cooling medium such as deionized water or the like. For this purpose, the cooling unit may be connected to a reservoir with a coolant (not shown). Circulation of the coolant is ensured by a provision of a pump (not shown) installed in a line between the reservoir (not shown) and the cooling unit 87. A manifold 97 for collection and distribution of the coolant between the reservoir and the cooling unit 87 consists of a stationary part 97a and a rotating part 97b attached to the shaft 28 with respective sealing device 97c and 97d therebetween.

Figure 4:
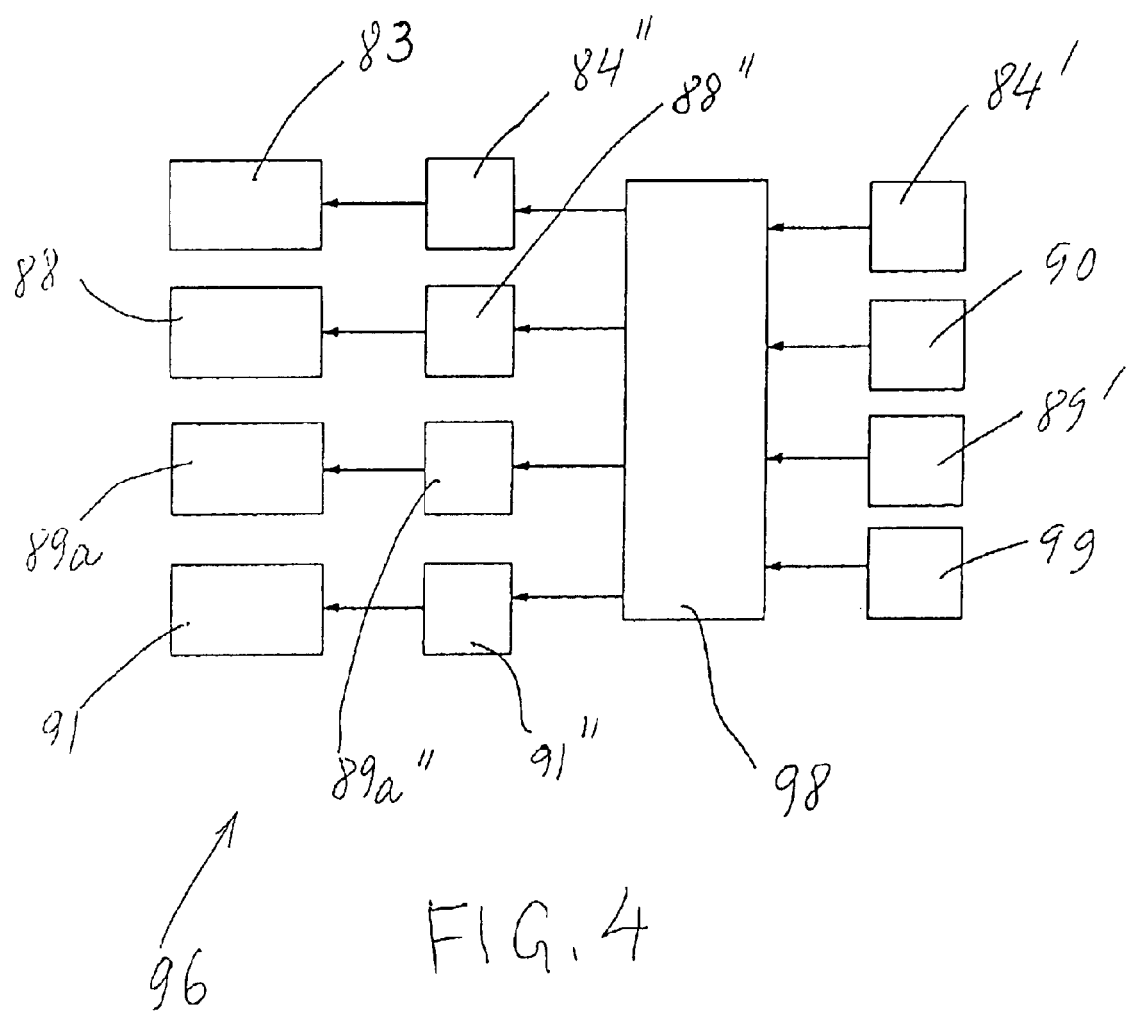
FIG. 4 is a block diagram of a temperature and pressure control system of the apparatus.

FIG. 4 is a schematic block diagram of a temperature and pressure control system 96 of the apparatus 20. The system 96 consists of a controller 98 which interconnects the actuating units such as chuck heater 83, coolant pump 89a, solution heater 88, solution supply pump 91 with respective sensors and measurement device, i.e., a thermocouple 84' for measuring temperature of the chuck 26, a thermocouple 89' for measuring temperature of the coolant in the tank (not shown), a thermocouple 90 (FIG. 1) for measuring temperature of the working solution in the working chamber 22, and the pressure gauge 99 (FIG. 1). The controller controls operation of respective actuating mechanism (heaters, pumps, etc.) via a respective power supply units 84", 88", 89a", and 91" (FIG. 4).

FIG. 5 is a schematic view of a chuck heater/cooler unit 183 according to another embodiment of the invention. The unit 183 is also built into the body of the substrate-holding chuck 126 and may work in the mode of heating or cooling. As shown in this drawing, the chuck 126 has a Peltier-type cooler-heater 127 which is built into the body of the chuck 126 and comprises a package of two semiconductor plates which operate on the principle of generation of heat, when the current flow in one direction, and of absorption of heat, when the current flows in the opposite direction. Direction of the current is changed through the use of a switch 129 that changes polarity on the semiconductor plates. The rest of the chuck heater/cooler unit 183, i.e., the transfer of current between the rotating parts, etc., is the same as in the device shown in FIG. 3.

A provision of the Peltier-type heater-cooler 127 makes it possible not only to heat the working surface of the chuck 126, and hence of the substrate W, but also to quickly cool the holder surface and the substrate W, which is an essential for realization of the method of the invention based on deposition of metals from the solution at reduced temperature of the solution in combination with heated chuck surface that can be quickly cooled.

Operation of the Apparatus of the Invention

For electroless deposition of a predetermined thin-film coating onto the surface of a substrate W in the apparatus 20 of the invention (FIG. 1), the cover 24 of the apparatus 20 is raised, and a substrate W is placed onto an edge-grip mechanism 44 of the substrate holder 26 manually or via the loading port 60 by means of an mechanical arm of a robot (not shown) that can be located near the apparatus 20 or be a part of this apparatus. After the substrate is clamped in place by the gripping mechanism 44, solutions are supplied via the chemical dispensing arm 94 (FIG. 2). When this process is completed, the cover 24 goes down so that the edge 23 of the cover 24 rests onto the edge 27 of the cover support 25. Closing of the cover 24 is carried out by means of the mechanism 76. The entire chamber 22 is sealed after the gate 62 is closed. The edge-grip mechanism 44 descends into the plate-like body of the substrate holder 26. Descending of the edge-grip mechanism 44 is carried out with the use of pneumatic cylinders 56 and 58.

The substrate holder 26 and the edge-grip mechanism 44 located therein and supporting the substrate W begin to rotate from the motor 36 via the synchronization belt 40 and respective gear wheels 34 and 38. At the same time, a deposition solution (or solutions) is/are selectively supplied to the chamber 22 via the tube 75b, tube 81, or tube 78 (FIG. 1). The substrate surface is first uniformly wetted, and then the solution/solutions is/are uniformly distributed within the chamber 22.

In a typical mode of operation, the solution is supplied to the chamber 22 at a temperature from 16° C. to 95° C.

While the substrate is heated by a heater (83, 127), the solution is supplied to the working chamber 22 at a relatively low temperature that prevents the solution from thermal decomposition. The solutions can be selectively supplied in a required sequence from the main tank 64 or from auxiliary tanks 66a, 66b, 66c . . . via the chemical dispensing arm 94. The supply of the solutions at room temperature makes it possible to reduce the speed of solution recirculation and increase the service life of the solution. As a result, it become possible to reduce the production cost per unit of the treated wafer.

For efficient deposition of metals from the solution, the temperature on the surface of the substrate W supported in the substrate holder 26 is maintained within the range from 16° C. to 120° C. Actual optimal temperatures of solutions and substrate surfaces are determined experimentally. For example, for deposition of cobalt the temperature of the solution should be within the range from 50° C. to 120° C. With the solution temperature in the above range, the best results can be obtained when a silicon substrate is maintained at a temperature from 16° C. to 140° C.

If necessary, the deposition solution may be supplied to the chamber 24 through the chamber bottom 32 from the main solution tank 64 by the pump 93 via the line 81.

As has been mentioned above, according to the method of the present invention, it is preferable to perform the deposition process at a relatively low temperature of the solution. If necessary, however, the solution may be subjected to heating with the heater 88, and pressure in the chamber 22 may be increased by supplying a neutral gas, e.g., $N^2$, to the chamber 22. All these operations are performed under the control of controller 98 (FIG. 4).

In fact, the deposition process is carried out in the closed space (FIG. 1) defined by the cover 24 and the cover support 25. During operation, the substrate holder 26 with the edge-grip mechanism 44 and wafer W in it are located in the aforementioned closed space.

Upon completion of the deposition operation, the supply of the solution by the pump 91 is discontinued, the solution returns to the tank 64, and the controller 98 (FIG. 4) sends a command to respective actuating devices (heaters, pumps, etc.) via their power supplies 84", 88", etc., for activation of these devices. In this case, appropriate commands are sent by the controller 98 for closing some of the solenoid valves, opening other valves, and activating other appropriate mechanisms known in the art.

One essential advantage of the method and apparatus of the present invention is the use of a temperature-controlled substrate holder that incorporates both a heater and a cooler of the type shown in FIGS. 3 and 5. This allows more flexible temperature control of the deposition process and broadens technological capacities of the apparatus. For example, in some processes, it may require to perform very quick cooling of the substrate for immediate discontinuation of the deposition process.

During operation of the apparatus with the substrate holder shown in FIG. 3, the chuck 26, and hence the surface S of the substrate W, is heated by the electric heater 83 to a required temperature under control of the temperature and pressure control unit 96 shown in FIG. 4. Electric current is supplied to the heater 83 through sliding current contacts 84*a*, 84*b* which are in electrical contact with current collecting rings 85*a*, 85*b* on the rotating shaft 28, which are connected to the heater 83 by conductors 85*c* and 85*d*.

When it is necessary to quickly cool the heater 83, it is done by the cooling unit 87 built into the body of the chuck 26 in the form of a spiral channel for the passage of a cooling medium such as deionized water or the like. Circulation of the coolant is ensured by a provision of a pump installed in a line between a reservoir and the cooling unit 87.

In the case of the combined Peltier-type cooler/heater shown in FIG. 5, the substrate-holding chuck 126 can be heated or cooled from the same device. Direction of the current is changed through the use of a switch 129 that changes polarity on the semiconductor plates. A provision of the Peltier-type heater-cooler 127 makes it possible not only to heat the working surface of the chuck 126, and hence of the substrate W, but also to quickly cool the holder surface and the substrate W, which is an essential for realization of the method of the invention based on deposition of metals from the solution at reduced temperature of the solution in combination with heated chuck surface that can be quickly cooled.

Thus, it has been shown that the apparatus and method of the invention are based on the use of a room-temperature working solutions in combination with a heated substrate chuck. It is important to note that the aforementioned temperature control cycles can be combined with replacement of solutions, variations in the solution concentration, variation in the solution temperature, etc. The method and apparatus can be used in a wide range of various technological processes that may be required for electroless deposition. What is important and is indispensable for the method of the invention is to adjust and maintain a difference between the deposition solution temperature and the substrate temperature at a predetermined value.

Furthermore, the invention provides a method and apparatus for electroless deposition with the surface of the substrate to be treated facing upward, allow uniform deposition without formation of stagnation areas under static conditions or at relatively low speeds of working solution flows and without thermal decomposition of the working solution due to the use of large volumes of working solutions at relatively low temperatures in combination with a temperature-controlled substrate holder, and allow bubble-free deposition without the use of complicated substrate motion mechanisms. The method of the invention is characterized by optimized control of temperature on the substrate and/or in the entire volume of the working solution.

The invention has been shown and described with reference to specific embodiments, which should be construed only as examples and do not limit the scope of practical applications of the invention. Therefore any changes and modifications in technological processes, constructions, materials, shapes, and their components are possible, provided these changes and modifications do not depart from the scope of the patent claims. For example, the process can be carried out under increased pressures for use of high-pressure process advantages such as suppression of gas evolution. The process can be carried out at temperatures of the substrate and solution different from those given in the specification.

What is claimed is:

1. A method for electroless deposition of a material in the form a thin film of said material on at least one side of a substrate at a substrate temperature from a deposition solution at a deposition solution temperature in a working chamber of an electroless deposition apparatus, comprising:

providing said apparatus with a substrate holder equipped with a substrate cooler and a substrate heater;

placing said substrate into said substrate holder in a position of said at least one side of the substrate facing upward;

supplying said deposition solution into said apparatus;

adjusting a difference between said deposition solution temperature and said substrate temperature to a predetermined value at least with the use of at lease one of said substrate cooler and a said substrate heater;

maintaining said difference between said deposition solution temperature and said substrate temperature at said predetermined value;

conducting said electroless deposition; and discontinuing said electroless deposition when said thin film reaches a predetermined thickness.

2. The method of claim 1, wherein said deposition solution temperature is lower than said substrate temperature.

3. The method of claim 2, wherein said deposition solution temperature can be selected within the range from 16° C. to 120° C., and wherein said substrate temperature can be selected within the range from 16° C. to 140° C.

4. The method of claim 1, further comprising the step of supplying a gas under controlled pressure into said working chamber.

5. The method of claim 1, wherein said substrate cooler and a substrate heater comprises one and the same unit that can function selectively as a heater or a cooler.

6. The method of claim 1, wherein said deposition solution is supplied to said working chamber at room temperature and wherein said substrate holder temperature exceeds room temperature.

7. The method of claim 1, wherein said step of supplying said deposition solution into said apparatus comprises wetting said at least one side of the substrate.

8. A method for electroless plating, comprising:

maintaining a substrate holder within a temperature range;

exposing a substrate held by the substrate holder to a deposition solution having a temperature less than a temperature of the substrate holder; and altering the temperature of the substrate holder to be less than the temperature of the deposition solution subsequent to the step of exposing the substrate to the deposition solution.

9. The method of claim 8, wherein the step of maintaining the substrate holder within a temperature range comprises maintaining the substrate holder between approximately 16° C. and approximately 140° C.

10. The method of claim 8, wherein the temperature of the deposition solution is between approximately 16° C. and approximately 95° C.

11. The method of claim 10, wherein the temperature of the deposition solution is between approximately 16° C. and approximately 25° C.

12. The method of claim 8, wherein the step of maintaining the substrate holder within the temperature range comprises heating the substrate holder.

13. The method of claim 12, wherein the step of heating the substrate holder comprises applying electric current to a heater built into the substrate holder.

14. The method of claim 12, wherein the step of heating the substrate holder comprises flowing current in a substantially similar direction through a plurality of semiconductor plates within the substrate holder.

15. The method of claim 8, wherein the step of altering the temperature of the substrate holder comprises passing a cooling medium through a channel within the substrate holder.

16. The method of claim 8, wherein the step of altering the temperature of the substrate holder comprises flowing current in substantially opposite directions through a plurality of semiconductor plates within the substrate holder.

17. A method for electroless deposition, comprising:

heating a substrate holder while depositing a film upon a substrate; and cooling the substrate holder to discontinue the deposition process.

18. The method of claim 17, wherein the step of cooling the substrate bolder comprises reducing the temperature of the substrate holder to a temperature lower than a temperature of a plating solution used for depositing the film.

19. The method of claim 17, wherein the step of heating the substrate holder comprises heating the substrate holder to a temperature higher than a temperature of a plating solution used for depositing the film.

* * * * *

UNITED STATES PATENT AND TRADEMARK OFFICE
CERTIFICATE OF CORRECTION

PATENT NO. : 6,846,519 B2
DATED : January 25, 2005
INVENTOR(S) : Ivanov et al.

It is certified that error appears in the above-identified patent and that said Letters Patent is hereby corrected as shown below:

<u>Title page,</u>
Item [75], Inventors, please delete "Jonathan Welgun Zhang" and substitute therefor
-- Jonathan Weiguo Zhang --.

<u>Column 14,</u>
Line 29, please delete "lease" and substitute therefor -- least --.
Line 30, after the phrase "substrate cooler and" please delete "a".

Signed and Sealed this

Twenty-second Day of November, 2005

JON W. DUDAS
*Director of the United States Patent and Trademark Office*